(12) United States Patent (10) Patent No.: US 8,740,107 B2
Marchetti et al. (45) Date of Patent: Jun. 3, 2014

(54) LIQUID ATOMISER WITH PIEZOELECTRIC VIBRATION DEVICE HAVING AN IMPROVED ELECTRONIC CONTROL CIRCUIT, AND ACTIVATION METHOD THEREOF

(75) Inventors: Fabio Marchetti, Povo (IT); Daniel Mosconi, Rabbi (IT)

(73) Assignee: Zobele Holding S.p.A., Trento (IT)

( * ) Notice: Subject to any disclaimer, the term of this patent is extended or adjusted under 35 U.S.C. 154(b) by 1048 days.

(21) Appl. No.: 12/763,377

(22) Filed: Apr. 20, 2010

(65) Prior Publication Data

US 2010/0264234 A1 Oct. 21, 2010

(30) Foreign Application Priority Data

Apr. 20, 2009 (IT) .............................. MI2009/A0654

(51) Int. Cl.
*B05B 17/04* (2006.01)
*H01L 41/04* (2006.01)
*B05B 17/06* (2006.01)

(52) U.S. Cl.
CPC ........... *H01L 41/042* (2013.01); *B05B 17/0607* (2013.01)
USPC ...... 239/4; 239/69; 239/70; 239/99; 239/101; 239/102.2; 239/332; 222/333; 310/317; 310/323.01

(58) Field of Classification Search
USPC ................. 239/4, 67, 69, 70, 99, 101, 102.1, 239/102.2, 332; 222/333; 310/316.01, 317, 310/323.01
See application file for complete search history.

(56) References Cited

U.S. PATENT DOCUMENTS

| 3,885,902 | A | 5/1975 | Fujieda et al. |
| 4,319,155 | A | 3/1982 | Nakai et al. |
| 4,641,053 | A | 2/1987 | Takeda |
| 4,689,515 | A | 8/1987 | Benndorf et al. |
| 5,099,815 | A | 3/1992 | Yamauchi et al. |
| 5,534,741 | A * | 7/1996 | Smith ........................ 310/317 |
| 7,467,752 | B2 * | 12/2008 | Sweeton ................... 239/102.2 |
| 2002/0011762 | A1 | 1/2002 | Klenk et al. |
| 2005/0029905 | A1 | 2/2005 | Dal et al. |

FOREIGN PATENT DOCUMENTS

DE 10122065 A1 12/2002
WO 00/51747 A 9/2000

OTHER PUBLICATIONS

European Search Report in Corresponding Application No. EP 10 15 9983 dated May 26, 2010.

* cited by examiner

*Primary Examiner* — Steven J Ganey
(74) *Attorney, Agent, or Firm* — Young & Thompson

(57) ABSTRACT

A liquid atomizer (1) with battery-powered (1) piezoelectric vibration device (4), of the type timed to occur between alternate activation cycles and rest cycles and including a first electronic supply circuit (2) with an impulse current generator (9) at a relatively high voltage and a second supply circuit (5a) of the piezoelectric vibration device (4) at a relatively low voltage, as well as a switch device (10, 11) apt to connect in alternate phases the supply of the piezoelectric vibration device (4)—in a same actuation cycle—to the first circuit and to the second circuit. An actuation method of the atomizer is also described.

20 Claims, 2 Drawing Sheets

Fig. 3A  Battery voltage: 1.5 V

Fig. 3B  Battery voltage: 1.0 V

LIQUID ATOMISER WITH PIEZOELECTRIC VIBRATION DEVICE HAVING AN IMPROVED ELECTRONIC CONTROL CIRCUIT, AND ACTIVATION METHOD THEREOF

FIELD OF THE INVENTION

The present invention concerns the sector of atomisers of liquid agents wherein atomisation occurs by means of a piezoelectric vibration device, more specifically the invention concerns an atomiser of this type with an improved electronic control circuit of the piezoelectric device.

STATE OF THE PRIOR ART

Figure 1:
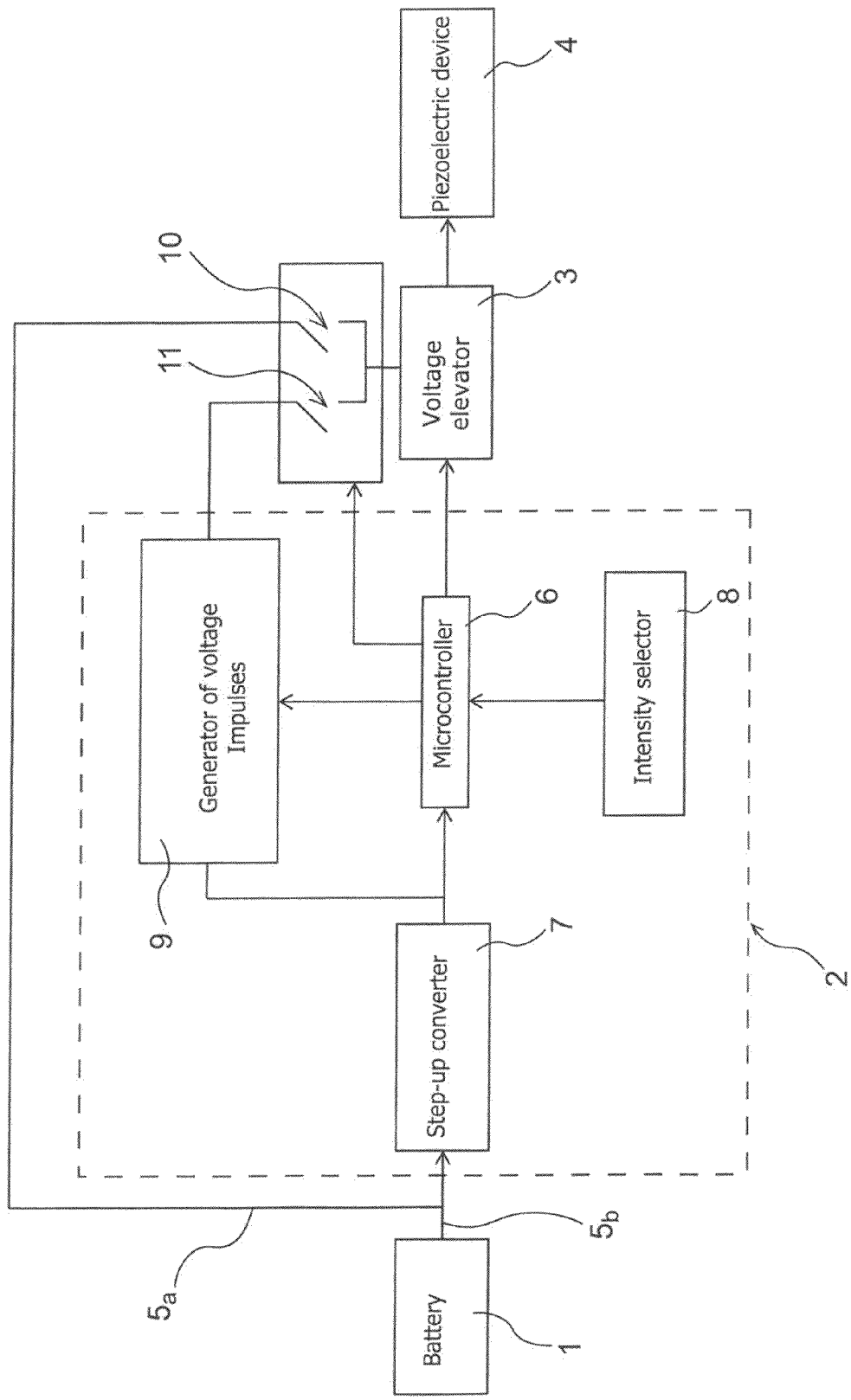
Figure 2:
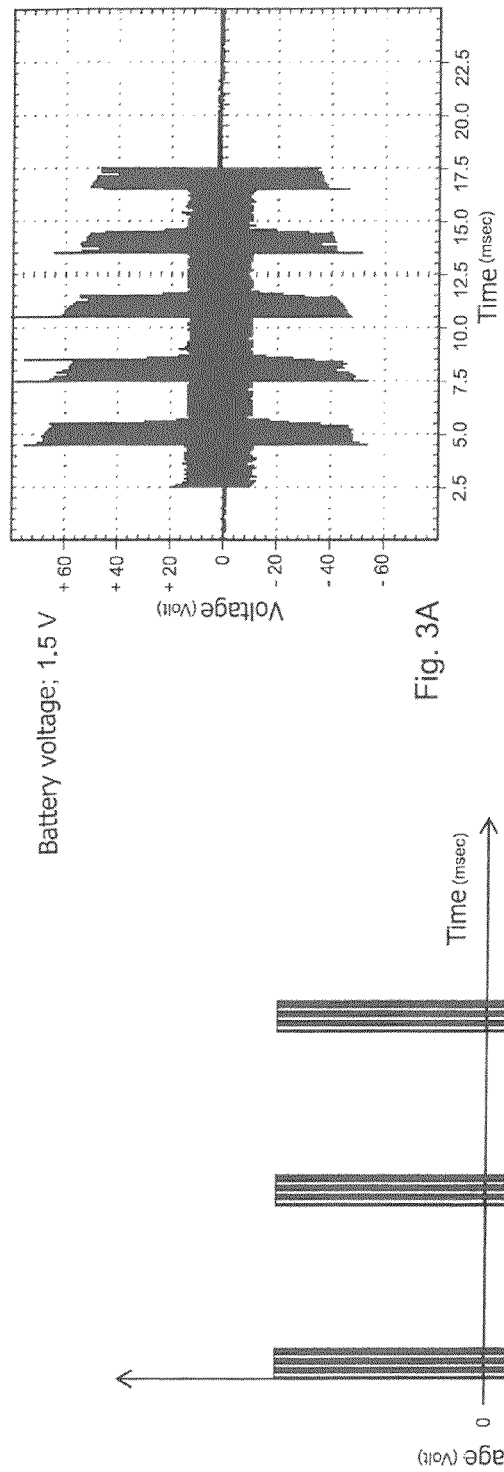
Figure 2:
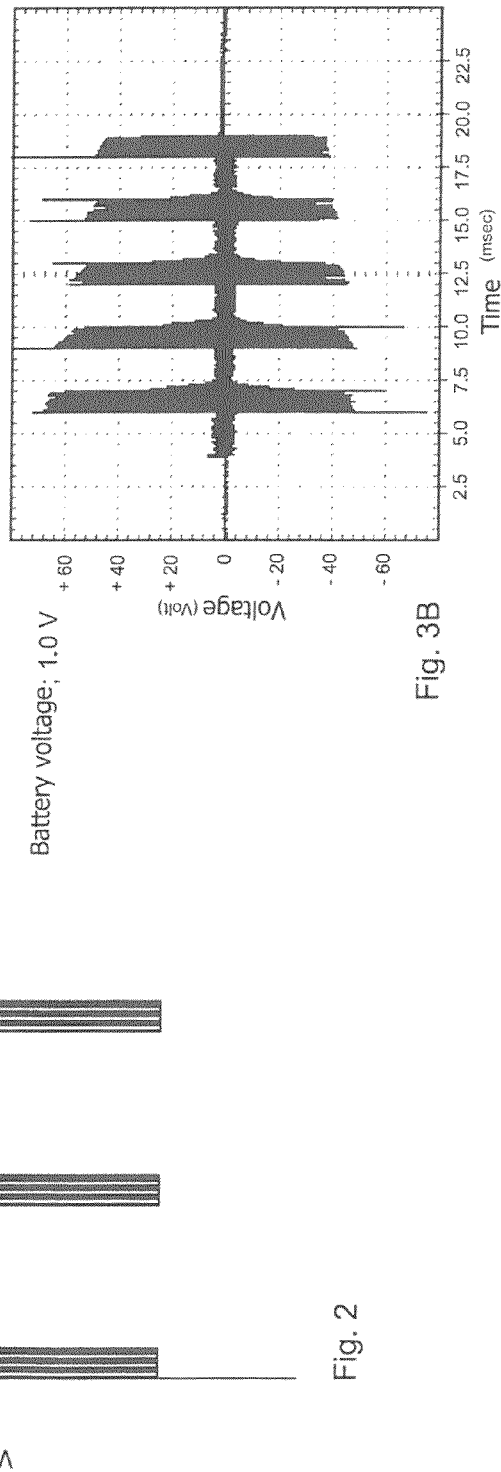

Atomisers of liquid agents which employ piezoelectric vibration devices to achieve atomisation and dispersion in the shape of microparticles of the liquid to be nebulised in the environment have been known for some time. Such atomisers generally consist of an alternate-current power generator connected to a piezoelectric element, so as to cause the subsequent fast contraction and expansion thereof. The piezoelectric element—for the atomisation of the liquid to be nebulised to occur—is coupled with a finely perforated, flexible membrane, as free as possible from mechanical constraints, which lies directly in contact with the liquid to be nebulised or in proximal contact with the free end of a porous wick immersed in a tank of said liquid. As can be easily understood, the subsequent expansion and contraction steps of the piezoelectric element cause the vibration of the perforated membrane, and consequently the atomisation of the liquid which has reached by capillarity the membrane through the holes provided in the same, as well as the subsequent dispersion of the liquid in the environment in the form of microparticles.

The piezoelectric element is normally provided with an electronic excitation and control circuit which allows a temporisation of the operation of the piezoelectric element, and in particular a regular alternation of actuation cycles and of rest cycles of the same. As a matter of fact, a temporisation of this type allows to easily control the flow rate of nebulised liquid, to avoid excessive overheating of the piezoelectric material and of the perforated membrane which may impair the duration thereof and to finally reduce the consumption of activation energy, the last one being a feature which is especially useful in battery-operated atomisers, so as to increase the autonomy thereof.

An atomiser for liquids of the above specified type is disclosed for example in EP 0123277 which describes a method to actuate an ultrasonic oscillator for the atomisation of liquids, wherein the oscillator is supplied by an electronic excitation circuit with alternate power voltage, the frequency of which is adjusted to the optimal oscillation power of the oscillator. The electric energy to the oscillator is temporised cyclically between a first value, applied in a first period of time and sufficiently high to exceed the start threshold of the liquid atomisation process also in unfavourable conditions, and a second value—applied in a second period of time and lower than the preceding one—so that the total delivered power, mediated between the two overall considered time intervals, is proportional to the amount of delivered liquid to be atomised per time unit.

Subsequently, EP 1159079 describes a liquid atomiser provided with a battery-powered, temporised, piezoelectric vibration device, wherein, in order to obtain a longer period of service without decline of the atomising performances, the vibrating membrane is caused to vibrate at a high width at the beginning of each activation period, and is then caused to vibrate at a lower width for the remaining part of said activation period.

Problem and Solution

Despite the above-cited last improvement, there is still a strong demand by the market for more efficient battery-operated, portable atomisers having an even longer duration of service. The Applicant has hence studied extensively this problem identifying some innovative technical solutions, based on which the present invention has been devised.

The object of the present invention is hence to provide a more efficient piezoelectric atomiser for the atomisation of liquids through an optimisation of the vibration process of the active element (piezoelectric element and perforated membrane) which further reduces—the performance in the diffusion of finely powdered liquids being equal—the consumption of electric energy, thus extending the useful service period of batteries in portable devices.

Said object is achieved by means of an atomiser having the features defined in claim 1, the dependent claims concerning some further preferred features and embodiments of the invention.

BRIEF DESCRIPTION OF THE DRAWINGS

Further features and advantages of the invention will be in any case better evident in the following detailed description of a preferred embodiment thereof, given purely by way of a non-limiting example, and with reference to the accompanying drawings, wherein:

FIG. 1 is an exemplifying block diagram of an electronic control circuit for an atomiser with a piezoelectric vibration device according to the invention; and FIG. 2 is a diagram showing the trend over time of the actuation cycles and of the rest cycles of the piezoelectric vibration device;

FIG. 3A is a diagram showing the trend over time of the electric excitation voltage of the piezoelectric vibration device during an individual actuation cycle, obtained by means of the electronic control circuit shown in FIG. 1, with a fully charged supply battery of 1.5 V; and FIG. 3B is a diagram similar to the one of FIG. 3A with a partly empty supply battery, capable of delivering a voltage of 1.0 V.

DETAILED DESCRIPTION OF THE PREFERRED EMBODIMENT

The electronic control circuit which is described in the following can be used on any prior-art atomiser which provides the use of an electrically excited piezoelectric element to determine the atomisation of the liquid to be nebulised—supplied directly or through a wick—to a vibrating membrane connected to said piezoelectric element. For this reason the intrinsic structure and operation of the atomiser device are not relevant for the present invention and are hence not further described or shown here.

The block diagram shown in FIG. 1 shows diagrammatically the constituent components of the electronic excitation circuit of the piezoelectric device of an atomiser according to the invention. Such circuit comprises a battery 1 which delivers direct current, a supply block 2 apt to deliver an excitation voltage according to time-controlled impulses, and finally a voltage elevator 3 which receives said excitation current and supplies a piezoelectric device 4. Impulse voltage supply block 2 comprises inside a DC/DC step-up converter 7, supplied through connection 5b by battery 1 and apt to increase the exit voltage thereof, which voltage is delivered to an impulse generator 9 and to a programmable control device consisting of a microcontroller 6. Microcontroller 6 acts as frequency generator of the circuit and controls the operation of impulse generator 9, and of voltage elevator 3. The generated frequency is obtained by a mathematical algorithm and is a submultiple of the operation frequency of the microcontroller. The temporisation of the exit impulses of generator 9—that is, the time interval between two subsequent trains of impulses generated by the excitation circuit and applied to the piezoelectric element (rest cycle)—can be adjusted by means of an intensity selector 8, and is diagrammatically shown in FIG. 2.

The overall functionality of supply block 2 and the intrinsic features of the different components thereof—as can be understood from the above-reported brief description—are all known per se from the above-described prior-art documents or from the general knowledge of a person skilled in the field, so that it is not believed necessary here to enter in the construction details of the same.

According to the main feature of the present invention, in addition to connection 5b to supply block 2, battery 1 has a second connection 5a in parallel, directly to voltage elevator 3, said two connections can be alternatively actuated by a switching device controlled by microcontroller 6 and comprising switches 10 and 11, arranged on connection 5a and on the output of impulse generator 9 connected to voltage elevator 3, respectively. With this circuit structure it is hence possible to select the excitation voltage of piezoelectric device 4 between one low-voltage excitation and constant width, when switch 10 is closed and switch 11 is opened, and a higher-voltage excitation, with an exponentially decreasing travel, typical of a capacitor discharge, when the switches are in an opposite position and generator 9 is active.

The operation of the electronic control circuit of the above described piezoelectric device is relatively simple, and is based on the discovery made by the Applicant during his tests that it is possible to obtain a high operation efficiency of piezoelectric-device atomiser apparatuses when—within a same activation period—the excitation of the active element is quickly alternated between cycles with relatively high voltage and cycles with relatively low voltage.

Here and in the following, when one refers to an excitation with relatively low voltage it is understood the voltage which can be delivered directly by the batteries normally used for this type of devices and hence a voltage ranging between a maximum voltage value when the batteries are fully charged and a minimum voltage value corresponding to the voltage at which the batteries still manage—in a preset time interval—to supply suitable current for device operation. In the specific case of use of AA-type batteries, this voltage range lies between 1.6 Volt (maximum voltage) and 0.9 Volt (minimum voltage) upstream of voltage elevator 3, which causes that the relatively low voltage which excites piezoelectric device 4, downstream of voltage elevator 3, lies between about 40 Volt peak-to-peak and 10 Volt peak-to-peak. When, here and in the following, one refers to a relatively high-voltage configuration, the peak voltage of impulse generator 9, measured downstream of voltage elevator 3, is intended, which is 2-20 times higher than the above-said relatively low voltage.

A possible explanation of the improved efficiency of the atomiser when operating first with a low-voltage excitation followed by a high-voltage excitation, which, however, must not be interpreted as limiting the scope of protection of the invention, is that during the excitation cycles with a relatively low voltage and hence with low-width vibrations an effect of improved supply and homogenisation of the liquid to be atomised on the vibrating membrane is substantially obtained, so that in the excitation cycles with a relatively high voltage and hence with high-width vibrations one obtains a higher atomising flow rate than the one which can be obtained in the known systems wherein the vibration width is constant or monotonously decreasing from its initial value.

Therefore, as can be understood from the above-described diagram, microcontroller 6 adjusts the intensity of delivery of the nebulised product, acting on the fast alternate closing of the two switches 10 and 11 for the entire duration of each impulse, thus alternating the supply to voltage elevator 3 and hence to piezoelectric device 4 between a constant excitation at a relatively low voltage coming directly from battery 1 and an excitation at an initially higher voltage coming from generator 9 and normally having an exponentially decreasing development. A further adjustment on the intensity of atomisation of the above device, measurable as quantity of nebulised product in a time unit, is obtained by means of the use by the user of switch 8, through which—as already seen above—the duration of the rest cycles of the active element can be adjusted.

In substance, a cyclical electronic circuit for the activation of piezoelectric device 4, based on a clearly defined temporisation of the two above-said steps is so provided, with a typical trend of the activation voltage shown in the diagrams of FIGS. 3A and 3B for batteries with an output voltage ranging between 1.5 Volt at full charge and 1.0 Volt when the battery is partly empty but still capable of providing to the recharge of the condenser included in impulse generator 9. In a first step switch 10 is closed, so that the voltage at the input of voltage elevator 3, pulsed at the frequency generated by microcontroller 6, is the voltage of battery 1, and therefore the oscillation of the piezoelectric device has a low and constant width, suitable—as said—to favour an even distribution of the liquid across the vaporising membrane avoiding both accumulations at the interface with the wick, and lack of liquid to be nebulised. In a second step, microcontroller 6 opens switch 10 and closes switch 11; the voltage at the input of voltage elevator 3, pulsed at the frequency generated by microcontroller 6, is thus the relatively high voltage of generator 9. These impulses, through voltage elevator 3, activate a more intense vibration of the piezoelectric device and hence of the vibrating membrane, with a resulting full nebulisation of the liquid product accumulated on the same during the previous step. The two steps are—as already said—quickly alternated during a single discharge impulse of generator 9 for very short durations, for example of 1-2 msec each, so that for each cycle of activation of piezoelectric device 4—generally lasting maximum 30 msec—one can have between 2 and 30 alternate steps of the above-described type. In a preferred application of the present invention, the duration of each individual cycle of activation is of 15 msec, step duration at a relatively low voltage is of 2 msec and step duration at a relatively high voltage is of 1 msec.

The advantages achieved by the atomiser according to the present invention are evident. Firstly, during the low-voltage operation steps a much lower consumption of battery 1 is achieved, and since such steps take up overall more than 50% of each activation cycle, the duration increase of the useful life of the battery is remarkable. Secondly, since the impulse generator works for 50% or less of each activation cycle, the condenser of such generator—the electrical features being equal to the previous, single-impulse ones of the prior art—discharges only partially for each activation cycle, further undergoing a first partial recharge during the activation steps at a relatively low voltage. This has two advantageous consequences: as a matter of fact, on the one hand, the difference of the relatively high voltage values between the first and the last peak step of each activation cycle is very moderate, fully to the advantage of the regularity of operation of the piezoelectric device and of its duration; on the other hand, condenser recharge during the rest cycle occurs more rapidly and with less power consumption.

However, it is understood that the invention must not be considered limited to the particular arrangement illustrated above, which represents only an exemplifying embodiment thereof, but that a number of variants are possible, all within the reach of a person skilled in the field, without departing from the scope of protection of the invention, as defined by the following claims.

The invention claimed is:

1. A liquid atomizer that operates between alternate activation cycles and rest cycles, comprising:
    a piezoelectric vibration device (4);
    a first supply circuit (2) with an impulse current generator (9) for activating said piezoelectric vibration device (4) with a relatively high voltage during the activation cycles;
    a second supply circuit (5a) for supplying energy to the piezoelectric vibration device (4) at a relatively low voltage; and
    a switch device (10, 11) that connects in alternate phases the piezoelectric vibration device (4) to one of said first circuit or said second circuit in order to alternately supply energy to the piezoelectric vibration device (4) through said first or said second circuit within a same activation cycle,
    wherein said second supply circuit (5a) consists of a direct connection to a power source (1).

2. The atomizer as claimed in claim 1, wherein, at a beginning of each activation cycle, an energy supply of said piezoelectric vibration device (4) is provided by said second circuit (5a) at the relatively low voltage.

3. The atomizer as claimed in claim 2, wherein, within a single activation cycle of the piezoelectric vibration device (4), said switch device (10, 11) alternates the energy supply between said first supply circuit and second supply circuit in subsequent phases, each phase having a duration of 1-2 ms.

4. The atomizer as claimed in claim 1,
    wherein said first supply circuit (2) further comprises a microcontroller (6), and
    wherein both the impulse current generator (9) and the microcontroller (6) are powered by a battery (1) through a step-up DC/DC converter (7).

5. The atomizer as claimed in claim 4, wherein said microcontroller (6) controls the impulse current generator (9) and the switch device (10, 11).

6. The atomizer as claimed in claim 5, further comprising:
    a voltage elevator (3) arranged between a common exit of said first and second circuit (2, 5a) and the piezoelectric vibration device (4).

7. The atomizer as claimed in claim 6, further comprising:
    an intensity selector (8) for changing the duration of said rest cycles.

8. The atomizer as claimed in claim 7, wherein said first supply circuit provides an impulse current with a relatively high initial voltage with respect to the voltage of the second supply circuit and with an exponentially decreasing trend.

9. The atomizer as claimed claim 8, wherein said second supply circuit provides a constant current at a relatively low voltage with respect to the initial voltage of the first supply circuit.

10. The atomizer as claimed claim 8, wherein said second supply circuit provides a constant current at a relatively low voltage with respect to the initial voltage of the first supply circuit.

11. The atomizer as claimed in claim 1, wherein said first supply circuit provides an impulse current with a relatively high initial voltage with respect to the voltage of the second supply circuit and with an exponentially decreasing trend.

12. The atomizer as claimed claim 11, wherein said second supply circuit provides a constant current at a relatively low voltage with respect to the initial voltage of the first supply circuit.

13. The atomizer as claimed in claim 12,
    wherein said relatively low voltage is a voltage ranging between 40 Volts peak-to-peak and 10 Volts peak-to-peak, and
    wherein said relatively high voltage is a voltage between 2 and 20 times greater than the relatively low voltage.

14. The atomizer as claimed in claim 11,
    wherein said relatively low voltage is a voltage ranging between 40 Volts peak-to-peak and 10 Volts peak-to-peak, and
    wherein said relatively high voltage is a voltage between 2 and 20 times greater than the relatively low voltage.

15. An activation method for a liquid atomizer with a battery-powered piezoelectric vibration device (4), comprising:
    alternating between activation cycles and rest cycles,
    wherein, each activation cycle comprises performing multiple alternate energy supply phases of the piezoelectric vibration device (4), said multiple alternate energy supply phases comprising relatively low voltage phases and relatively high voltage phases,
    wherein during the relatively low voltage phases, the piezoelectric vibration device (4) is directly connected to a battery (1), and
    wherein during the relatively high voltage phases, the piezoelectric vibration device (4) is connected to an impulse current generator (9).

16. The activation method claimed in claim 15, wherein a switch device (10, 11) controlled by a microcontroller (6) determines the alternating between said multiple alternate energy supply phases.

17. The activation method as claimed in claim 15, wherein a first supply phase at a beginning of each atomizer activation cycle, supplies energy at the relatively low voltage.

18. The activation method as claimed in claim 15, wherein each of said alternate energy supply phases within a single atomizer activation cycle has a duration of 1-2 ms.

19. The activation method as claimed in claim 18, further comprising:
    providing a voltage elevator (3) immediately upstream of the piezoelectric vibration device (4),
    wherein, in said relatively low-voltage phases, the voltage on the piezoelectric device 4 ranges between 40 Volts peak-to-peak and 10 Volts peak-to-peak, and
    wherein, in said relatively high-voltage phases, the voltage is between 2 and 20 times greater than said relatively low voltage.

20. The activation method as claimed in claim 15, further comprising:
    providing a voltage elevator (3) immediately upstream of the piezoelectric vibration device (4),
    wherein, in said relatively low-voltage phases, the voltage on the piezoelectric device 4 ranges between 40 Volts peak-to-peak and 10 Volts peak-to-peak, and wherein, in said relatively high-voltage phases, the voltage is between 2 and 20 times greater than said relatively low voltage.

* * * * *